United States Patent
Wan et al.

[11] Patent Number: 5,959,340
[45] Date of Patent: *Sep. 28, 1999

[54] THERMOPLASTIC MOUNTING OF A SEMICONDUCTOR DIE TO A SUBSTRATE HAVING A MISMATCHED COEFFICIENT OF THERMAL EXPANSION

[75] Inventors: Chang-Feng Wan; Richard Scott List, both of Dallas; Curtis Gene Garrett, Garland; Dwight U. Bartholomew, Dallas, all of Tex.

[73] Assignee: DRS Technologies, Inc., Parsippany, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/707,815

[22] Filed: Aug. 30, 1996

Related U.S. Application Data

[60] Provisional application No. 60/003,206, Sep. 5, 1995.

[51] Int. Cl.$^6$ .................................................. H01L 31/00
[52] U.S. Cl. ........................ 257/443; 257/444; 257/442
[58] Field of Search .................... 257/443, 444, 257/442, 401

[56] References Cited

U.S. PATENT DOCUMENTS

| | | | |
|---|---|---|---|
| 4,720,738 | 1/1988 | Simmons | 257/442 |
| 5,146,303 | 9/1992 | Kornrumpf et al. | 357/30 |
| 5,318,666 | 6/1994 | Elkind et al. | 156/643 |
| 5,348,607 | 9/1994 | Wojnarowski et al. | 156/298 |
| 5,391,604 | 2/1995 | Dietz et al. | 524/403 |
| 5,420,445 | 5/1995 | Chisholm et al. | 257/78 |
| 5,608,208 | 3/1997 | Nemirovsky | 257/448 |

OTHER PUBLICATIONS

*Webster's II New Riverside . . . Dictionary,* p. 439 published 1984.

*Primary Examiner*—Stephen D. Meier
*Attorney, Agent, or Firm*—Thelen Reid & Priest LLP

[57] ABSTRACT

This invention relates to mounting integrated circuits (IC) to multi-chip modules (MCM) or substrates. More specifically, it provides a method of mounting a semiconductor die such as a thin slice of Mercury Cadmium Telluride (MCT) to a silicon semiconductor substrate, a read-out integrated circuit (ROIC), using a thermoplastic to reduce stress on the MCT caused by mismatched Coefficients of Thermal Expansion (CTE). This process provides for an array of infrared photodetectors on a material such as MCT to be mounted to a read-out integrated circuit (ROIC) using the Vertical Integrated Photodiode (VIP) approach to FPAs, while allowing double sided interdiffusion of CdTe for surface passivation to reduce dark currents and improve performance, without the problems associated with mismatched coefficients of thermal expansion during high temperature processes.

15 Claims, 1 Drawing Sheet

THERMOPLASTIC MOUNTING OF A SEMICONDUCTOR DIE TO A SUBSTRATE HAVING A MISMATCHED COEFFICIENT OF THERMAL EXPANSION

This application claims priority under 35 U.S.C. §119(e)(1) of provisional application number 60/003,206, filed Sep. 9, 1995.

CROSS-REFERENCES TO RELATED APPLICATIONS

The following concurrently filed application is related to the instant application.

TI-18379

FIELD OF THE INVENTION

This invention generally relates to mounting integrated circuits (IC) to multi-chip modules (MCM) or substrates. The detailed embodiment relates to fabrication of Focal Plane Arrays (FPAs) used in digital imaging systems, and a method of mounting a semiconductor die such as a Mercury Cadmium Telluride (MCT) chip to silicon semiconductor substrate, a read-out integrated circuit (ROIC), using a thermoplastic to reduce thermal stress on the MCT caused by mismatched Coefficients of Thermal Expansion (CTE).

BACKGROUND OF THE INVENTION

Digital imaging systems employ focal plane arrays to sense image information. One important class of focal plane arrays is infrared sensing arrays. These arrays are useful for image detection and motion sensing. Infrared arrays detect infrared radiation that is given off by virtually all objects, including the detector array's components, in proportion to the objects temperature.

Different semiconductor materials are inherently sensitive to different portions of the electromagnetic spectrum as a result of their electronic energy band structure. Indium antimonide (InSb) and Mercury Cadmium Telluride (HgCdTe or MCT) are well known materials which are suitable for the detection of infrared radiation. While these materials are suited for infrared detection, they are not suitable for the formation of integrated circuits or other electronics to process the image information which is collected by the FPA formed on these materials. Consequently, it is the standard practice in the infrared sensing art to connect an infrared sensor from one of these materials to silicon based integrated circuits for processing of the image information produced from the infrared sensor. Thus the sensors are fabricated separately from the readout circuits and then mounted to a common substrate or circuit board. Alternatively, the sensors are fabricated on a piece of sensor material that has be mounted to the readout integrated circuit substrate.

One approach to fabricating FPAs for infrared digital imaging systems has been to create an array of p-n junction or heterojunction diodes that convert photons of a range of infrared frequencies into electronic signals to perform as optical detectors. Each diode in the array then defines a pixel within the photodetector array. These diodes are typically reversed biased and generate a current flow in proportion to the number of photons that strike the diode having a frequency which exceeds the band gap energy of the infrared material used to fabricate the diodes. The current flow for each diode can be monitored and processed to provide a digital image corresponding to the infrared energy incident to the diode array.

The diodes in the array are each formed as a junction of n-type and p-type semiconductor materials which define receptor regions for each photodetector. The materials used to fabricate the infrared detectors or photo diodes are typically semiconductors having elements from Group II and Group VI of the periodic table, such as mercury cadmium telluride (MCT). Using these materials, detectors have been used which operate in the lower infrared frequency band down to the limits of the available long wave length atmospheric window, i.e., at wavelengths of 8–12 microns. The detection of such long wavelength radiation, if it is to be done at only moderate cryogenic temperatures, e.g. at liquid nitrogen rather than liquid helium temperatures, is preferably done using a very narrow band gap semiconductor such as MCT. Compositions of MCT having a selectable band gap energy may be specified by varying the proportions of mercury and cadmium in the composition $Hg_{1-x}Cd_xTe$, hereinafter referred to generally as MCT.

In the formation of these photodetectors it is important to include a protective layer such as cadmium telluride (CdTe) on the MCT wafer to act as a passivation layer, antireflective coating and/or an insulator for conductive interconnect lines. Passivation of MCT during detector fabrication has been found to reduce dark currents arising from surface states. Dark currents are spurious currents which flow despite the complete lack of infrared light at the frequencies the detector is designed to detect. Dark currents thus are error currents or leakage currents across the junction of the diodes. They are caused by imperfections in the bulk or surface of the MCT. Dark currents which occur at the surface of the MCT are particularly troublesome. Dangling bonds at surfaces can contribute to surface imperfections which alter the electrical characteristics of the detectors, such as, the photocarrier lifetimes and surface recombination velocity. Other imperfections include extrinsic and intrinsic impurities, or dislocations of the MCT.

The surface imperfections can be reduced by application and interdiffusion of a passivation layer. Cadmium telluride (CdTe) has generally been used as the passivating material in the prior art. The CdTe is deposited on the MCT and heated to about 300° C. for several hours. The mercury then diffuses into the CdTe and the cadmium diffuses into the MCT to provide a graded rather than abrupt interface. Interdiffusion of the CdTe layer and the MCT layer eliminates the dangling bonds of the MCT layer and diffuses any remaining impurities away from the MCT surface.

Embodiments of the present invention are directed to the topside illuminated, or Vertically Integrated Photodiode (VIP) approach for fabricating FPAs. In this approach, a slice of group II and/or group VI elements such as MCT is epoxy mounted to a Read Out IC (ROIC). A ROIC is typically a silicon chip which has contact pads for each pixel of the detector array prefabricated on the silicon, in addition to circuitry for monitoring and processing the output of the photodiode detector array. After the diodes are formed on the MCT slice, the diodes are connected to the ROIC by etching holes through the MCT and connecting each diode to a corresponding contact pad on the ROIC with metal leads. This process in described in U.S. Pat. No. 4,720,738 issued to Arturo Simmons and incorporated herein by reference.

SUMMARY OF THE INVENTION

When semiconductor integrated circuits are mounted in packages or multi-chip modules the dies (the actual chip of semiconductor material with the imprinted electrical circuit) are usually attached to the packages or substrates using epoxy as an adhesive. Since epoxies are thermoset, i.e. their polymer chains are cross linked when heated and do not soften significantly after setting, subsequent thermal processes will induce compressive or tensile stress if the two mated parts have different coefficients of thermal expansion. Excessive stress can result in both mechanical and/or electrical failure of the parts. The present invention employs thermoplastics as adhesives, which by their nature reflow at their softening temperatures, to avoid these excessive stresses.

A preferred embodiment of the present invention is directed to mounting of a MCT to a ROIC. Although the benefits of passivation of MCT for FPA detectors with materials such as CdTe have been known, see for example U.S. Ser. No. 08/137,874 filed by Wan et. al and assigned to Texas Instruments Inc, since interdiffusion must be done at relatively high temperatures, interdiffusion poses problems for vertically integrated FPA structures. Specifically, the temperatures required for interdiffusion are too high for a MCT structure which has been epoxy mounted to a ROIC due to the mismatch in thermal expansion of the silicon ROIC compared to the MCT, resulting in damage to the MCT. Therefore, annealing the MCT to interdiffuse the CdTe subsequent to mounting the MCT is very difficult when a rigid adhesive such as epoxy is used to mount the MCT. Prior to the present invention, this VIP approach to building FPAs could not derive the benefits of interdiffusion of the CdTe passivation layer and has suffered in performance due to dark currents.

In accordance with the present invention, an improved method and structure is provided for a thermoplastic mounted MCT to an ROIC to implement a focal plane array. The method and structure includes diodes with topside interdiffusion of the CdTe passivation layer on the upper MCT surface as well as interdiffusion of the lower MCT surface with a lower passivation layer. The interdiffusions may be done subsequent to thermoplastic mounting the MCT to the ROIC to avoid the temperature stress problems discussed above.

In one embodiment, a layer of MCT is grown by Liquid Phase Epitaxy (LPE) on a cadmium zinc telluride (CZT) substrate. After preparation of the backside surface of the MCT, the MCT is passivated by interdiffusion of CdTe. The MCT is mounted with a thermoplastic adhesive to the ROIC. The MCT can then be passivated on the top surface by depositing a layer of CdTe. To complete the passivation process, the layers are annealed to interdiffuse the CdTe passivation layers, both frontside and backside, and the MCT. This embodiment procedure creates a double-side passivated MCT mounted on a ROIC where the interdiffusion passivation is done subsequent to the mounting on the ROIC without the detrimental effects caused by mismatched coefficients of thermal expansion or thermal stress.

An advantage of the present invention is the MCT can be processed after it is mounted to the ROIC or wafer. It also allows the MCT to be interdiffused with CdTe on both sides without the problems discussed above for materials with mismatched coefficients of expansion.

Thermoplastic materials have been used to provide an elastic bond for large silicon die to expandable substrates, see U.S. Pat. No. 5,391,604 issued to Dietz et al. However, this is apparently the first use of a thermoplastic mounting method to provide a thermoplastic bond for a semiconductor chip to a substrate to prevent damage due to mismatched coefficient of thermal expansion by allowing the adhesive to become soft again to prevent stress buildup in the semiconductor die. In contrast, previous methods such as disclosed by Dietz et al. use the elastic properties of the bonding material to prevent stress build up rather than the thermoplastic properties. In an embodiment, this is the first use of a thermoplastic mounting method to allow double sided passivation of a MCT which is mounted to an ROIC to implement a focal plane array. This is also apparently the first use of double sided interdiffusion of CdTe on a MCT as described above.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

Figure 1:
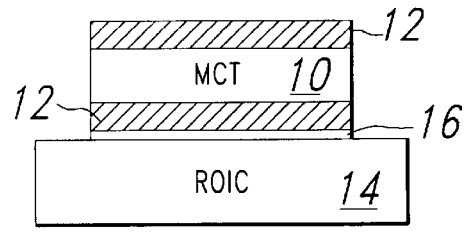
FIG. 1 Shows a preferred embodiment of the present invention showing double sided interdiffusion of MCT mounted to a ROIC.
Figure 2:
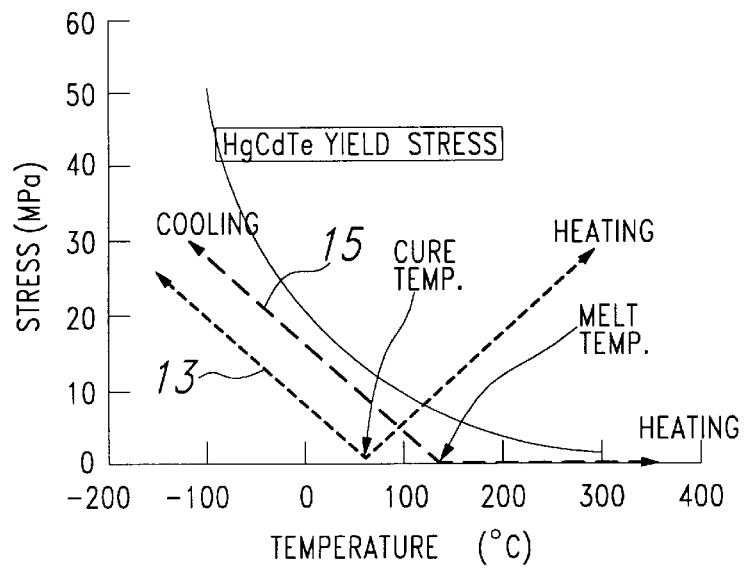
FIG. 2 Shows the stress curve for MCT and a typical thermoplastic.

The preferred embodiment of the present invention is best understood by referring to FIGS. 1–3 of the drawings, like numerals are used for like and corresponding parts of the various drawings.

As discussed above, integrated circuits dies are usually mounted in packages or multi-chip modules using epoxy as an adhesive. Since epoxies are thermoset, i.e. their polymer chains are cross linked when heated and do not soften significantly after setting, subsequent thermal processes will induce compressive or tensile stress if the two mated parts have different coefficients of thermal expansion. The present invention employs thermoplastic as a die adhesive to avoid excessive stresses caused by a mismatch in coefficient of thermal expansion.

With reference to FIG. 1, there is shown a completed structure of an embodiment of the present invention, wherein a MCT 10 chip which has double sided CdTe interdiffusion 12 for surface passivation is mounted with thermoplastic 16 to a silicon ROIC 14. With reference to FIGS. 3a–3d, there is shown a method of forming an embodiment of the present invention which is shown in the completed structure of FIG. 1.

FIG. 2 represents the stress curve of a MCT chip epoxy mounted to a ROIC. If the epoxy is cured at 60° C., heating or cooling from this temperature will result in thermal stress in the MCT at a rate of about 0.1 MPa/° C. as depicted with small dashed lines 13 in FIG. 2. The solid curved line in FIG. 2 represents the yield strength of the MCT. The yield strength is exceeded by the epoxy bonded device when the hybrid device is heated to 120° C., resulting in damage to the MCT. The dotted lined curve 15 in FIG. 2 represents the thermal stress in the MCT as a function of temperature when the thermoplastic adhesive is used to bond the hybrid device. It can be seen from curve 15 in FIG. 2 that the stress of the thermoplastic device does not exceed the yield strength of the MCT even when heated to 300° C. The yield strength is not exceeded in this case because the thermoplastic softens when its temperature reaches its softening temperature and relieves the thermal stress in the hybrid device.

Figure 3A:
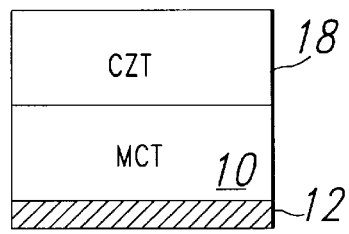
FIGS. 3a–3d Illustrate the sequence of processing steps for a method of fabricating a MCT structure according to the present invention.
Figure 3B:
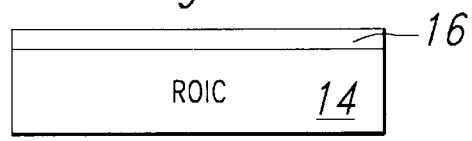
Figure 3C:
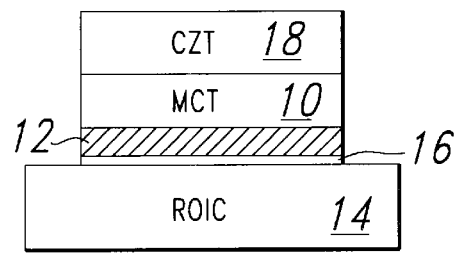
Figure 3D:
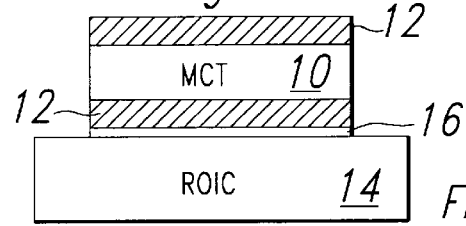

An overview of the process illustrated in FIGS. 3a–3d is as follows. FIG. 3a shows a layer of MCT 10 preferably grown by Liquid Phase Epitaxy (LPE) on a cadmium zinc telluride (CZT) substrate 18. After preparation of the top surface of the MCT, the MCT is passivated by interdiffusion of CdTe 12 as shown in FIG. 3a. FIG. 3b shows a ROIC coated with a thermoplastic adhesive 16. The MCT is mounted to the ROIC as shown in FIG. 3c using a thermoplastic adhesive 16. After removal of the CZT 20 a second passivation layer of CdTe is deposited on the top side of the MCT. The MCT with the CdTe layers is then annealed to interdiffusion the CdTe into the MCT. The ROIC module with the MCT as shown in FIG. 3d is then ready for processing to create the FPA.

A detailed discussion of the process illustrated in FIGS. 3a–3d, a method and structure of a preferred embodiment, is given in the following paragraphs. A layer of MCT 10 is grown by Liquid Phase Epitaxy (LPE) on a cadmium zinc telluride (CZT) substrate 16 to a thickness of between 10 and 200 $\mu$m. The MCT is planarized, preferably by diamond point turning (DPT) to remove irregularities caused by the LPE process. The MCT slice formed by LPE is preferably wax mounted to a silicon carrier, LPE side up, to facilitate processing. The top surface of the MCT is prepared for passivation by bromide polishing using a solution of ¼% bromine in methanol. The MCT is further prepared for passivation by rinsing on a spiner.

A layer of CdTe 12 is deposited on the MCT 10 for passivation as shown in FIG. 3b. Deposition of the CdTe is preferably accomplished by evaporating 5000 Å of 30° C. CdTe onto the surface of the MCT followed by deposition of 3000 Å of sputtered ZnS. The purpose of the ZnS is a diffusion barrier for contaminants and mercury during anneal. The MCT is then annealed to diffuse the CdTe into the MCT at 250–350° C. for 1–4 days. This first anneal may be eliminated and combined with the second anneal step below.

The MCT 10 which has now been passivated on one side is prepared to be mounted to the ROIC, CdTe side down. Prior to mounting the ZnS is preferably removed from the surface of the CdTe. The MCT is preferably mounted to the ROIC as shown in FIG. 3c using polyester or polyamide thermoplastics 16. It was found the viscosity and surface tension of the thermoplastic is sufficient to keep the IC's in place even at temperatures sufficiently above the thermoplastic softening temperature. A desirable softening temperature should be low enough such that the thermoplastic softens to relieve the thermal stress before yield strengths of the parts are exceeded, but it should not be so low that the bond loses its strength at service temperatures due to softening. A preferred softening temperature is between 100 and 150° C.

The steps in mounting the MCT to the ROIC preferably include the following steps:

1) Placing the ROIC on a hot plate and heating to between 140 and 180° C.

2) Applying a measured amount of thermoplastic to the IC.

3) Aligning and attaching the MCT to the ROIC.

4) Pressing the MCT to form a thin bondline of thermoplastic, preferably between 1 and 2 $\mu$m in thickness.

5) Allowing the thermoplastic to cool while holding the MCT as placed above.

After mounting to the ROIC, the CZT 18 is preferably removed by diamond point turning (DPT) and the MCT is preferably ground to near the desired final thickness. The MCT is preferably ground during the DPT process to about 20 $\mu$m in thickness. The MCT is then polished to its final preferred thickness of between 6 and 8 $\mu$m, preferably with ¼% bromine methanol.

The top surface of the MCT can now be passivated with CdTe. A layer of CdTe 12 is deposited on the top surface of the MCT 10 for passivation as shown in FIG. 3d. Deposition of the CdTe is preferably accomplished by evaporating 5000 Å of 30° C. CdTe onto the surface of the MCT. The MCT is then annealed to diffuse the CdTe into the MCT at 150–250° C. for 1–4 days. The MCT is now as shown in FIG. 2d mounted to the ROIC and is ready for processing to create the FPA by fabricating an array of photodetectors in the MCT and connecting them to the ROIC as discussed above.

The sole Table, below, provides an overview of some embodiments and the drawings.

TABLE

| Drawing Element | Preferred or Specific Examples | Generic Term | Other Alternate Examples |
|---|---|---|---|
| 10 | MCT (Mercury Cadmium Telluride) | | Chip Die |
| 12 | CdTe | Passivation Layer | |
| 14 | ROIC (Read Out Integrated Circuit) | Carrier Chip or Substrate | Multi-Chip Module |
| 16 | Thermoplastic | Thermoplastic | |
| 18 | CZT | Substrate | |

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A microelectronic structure for fabricating a focal plane array comprising:

(a) a readout integrated circuit; and (b) a MCT layer passivated on the top side and directly bonded to said read out integrated circuit with a thin layer of thermoplastic adhesive allowing for an array of photodetector devices to be fabricated in the MCT layer and directly connected to the readout integrated circuit with an array of vias formed through the MCT structure to the readout integrated circuit, wherein said thermoplastic adhesive is a material which melts when heated above a softening temperature, wherein said layer of thermoplastic adhesive is from 1–2 microns thick.

2. The array structure of claim 1, wherein said thermoplastic adhesive is a polyester thermoplastic with a softening temperature between 100° C. and 150° C.

3. The array structure of claim 1, wherein said thermoplastic adhesive is a polyamide thermoplastic with a softening temperature between 100° C. and 150° C.

4. The array structure of claim 1, wherein both top and bottom sides of said MCT are passivated.

5. The array structure of claim 4, wherein said passivation is interdiffused CdTe.

6. A structure comprising:

a silicon semiconductor substrate;

a semiconductor die; and a thin layer of a thermoplastic adhesive means for bonding said die to said substrate, said adhesive means melting when heated above a softening temperature which is higher than a service temperature, wherein viscosity and surface tension of said thin layer of adhesive above said softening temperature are sufficient to keep said semiconductor die in place.

7. A structure according to claim 6, wherein said die and said substrate have different coefficients of thermal expansion, and wherein said softening temperature is below a temperature at which a stress force exerted by one of said die and said substrate on the other thereof through said adhesive means exceeds a yield strength of said other thereof.

8. A structure according to claim 6, wherein said softening temperature is between 100° C. and 150° C.

9. A structure according to claim 8, wherein said adhesive means is a polyester thermoplastic.

10. A structure according to claim 8, wherein said adhesive means is a polyamide thermoplastic.

11. A structure according to claim 6, wherein said silicon semiconductor substrate is a readout integrated circuit and said semiconductor die is a mercury cadmium telluride layer.

12. A structure according to claim 11, wherein said mercury cadmium telluride layer is passivated on each side thereof.

13. A structure according to claim 12, wherein each said side of said mercury cadmium telluride layer is passivated by interdiffused cadmium telluride.

14. A structure according to claim 11, wherein said mercury cadmium telluride layer is passivated on a side thereof nearest said readout integrated circuit.

15. A structure according to claim 14, wherein said side of said mercury cadmium telluride layer nearest said readout integrated circuit is passivated by interdiffused cadmium telluride.

* * * * *